(12) United States Patent
Mashiyama et al.

(10) Patent No.: US 8,174,427 B2
(45) Date of Patent: May 8, 2012

(54) A/D CONVERTER AND SOLID-STATE IMAGING DEVICE

(75) Inventors: Hiroshi Mashiyama, Yokohama (JP); Satoshi Akabane, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 12/872,417

(22) Filed: Aug. 31, 2010

(65) Prior Publication Data
US 2011/0068967 A1  Mar. 24, 2011

(30) Foreign Application Priority Data
Sep. 18, 2009  (JP) .................. 2009-217894

(51) Int. Cl.
*H03M 1/56* (2006.01)
(52) U.S. Cl. .............. 341/169; 341/155; 341/136
(58) Field of Classification Search ........... 341/130–165
See application file for complete search history.

(56) References Cited

U.S. PATENT DOCUMENTS

| | | | | |
|---|---|---|---|---|
| 5,652,580 A | * | 7/1997 | Saxena | 341/50 |
| 5,877,714 A | * | 3/1999 | Satoh | 341/87 |
| 6,856,268 B2 | * | 2/2005 | Choi | 341/144 |
| 7,085,318 B2 | * | 8/2006 | Kondo et al. | 375/240.01 |
| 7,148,834 B2 | * | 12/2006 | da Fonte Dias | 341/162 |
| 7,511,652 B1 | * | 3/2009 | Liu et al. | 341/155 |

FOREIGN PATENT DOCUMENTS
JP  9-162742  6/1997

* cited by examiner

*Primary Examiner* — Lam T Mai
(74) *Attorney, Agent, or Firm* — Oblon, Spivak, McClelland, Maier & Neustadt, L.L.P.

(57) ABSTRACT

According to one embodiment, an A/D converter includes a determination circuit configured to determine whether a first analog signal is greater than a second analog signal or not, the first analog signal being a present A/D conversion target, the second analog signal being an immediately preceding A/D conversion target, a calculation circuit configured to add a reference voltage to a difference obtained by subtracting the second analog signal from the first analog signal, a generation circuit configured to generate a comparison voltage, a comparator configured to compare a calculated value of the calculation circuit with the comparison voltage, and a conversion circuit configured to convert a period into a digital signal, the period being required until the calculated value is identical with the comparison voltage by the comparator.

20 Claims, 10 Drawing Sheets

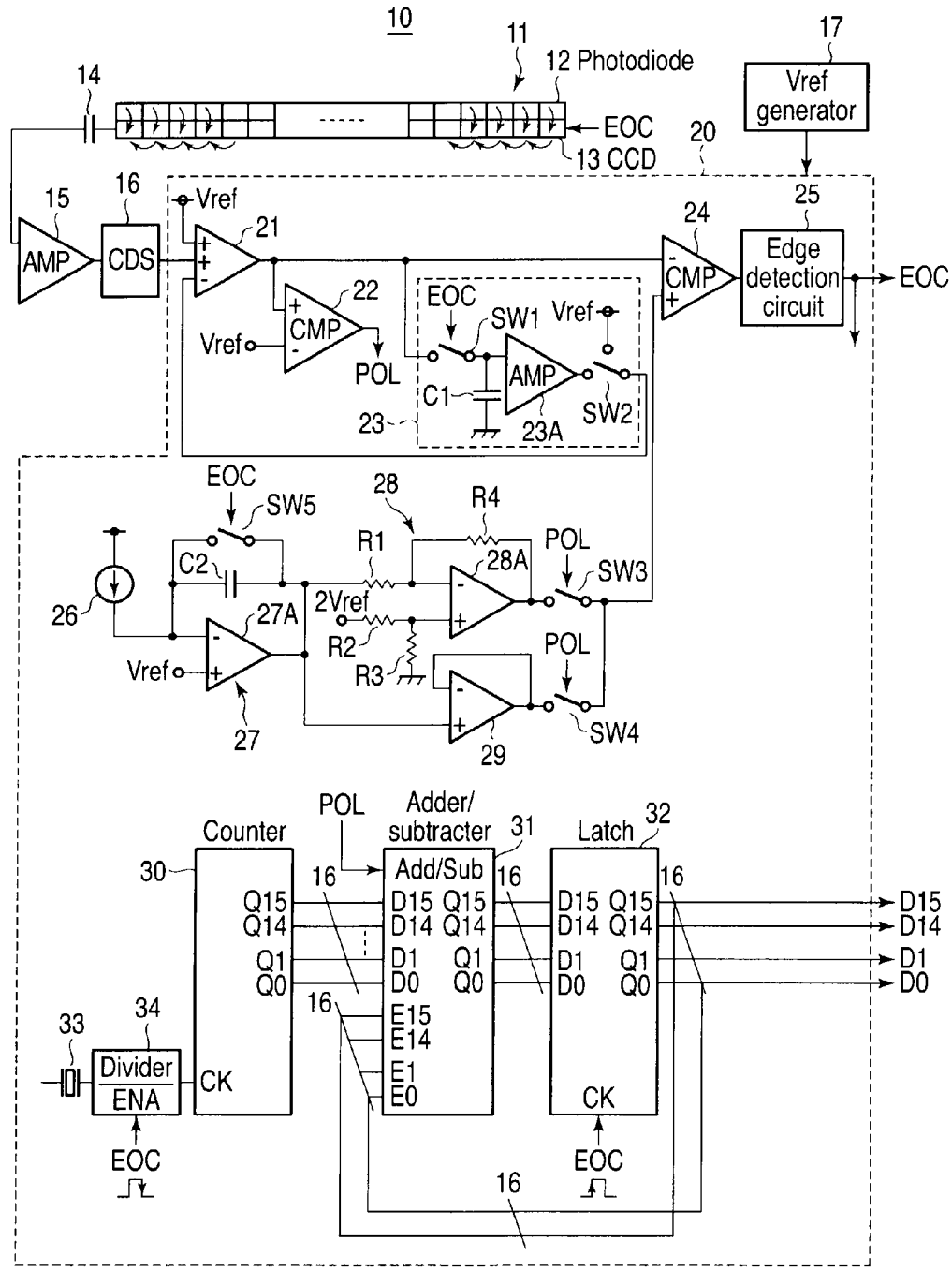
F I G. 1

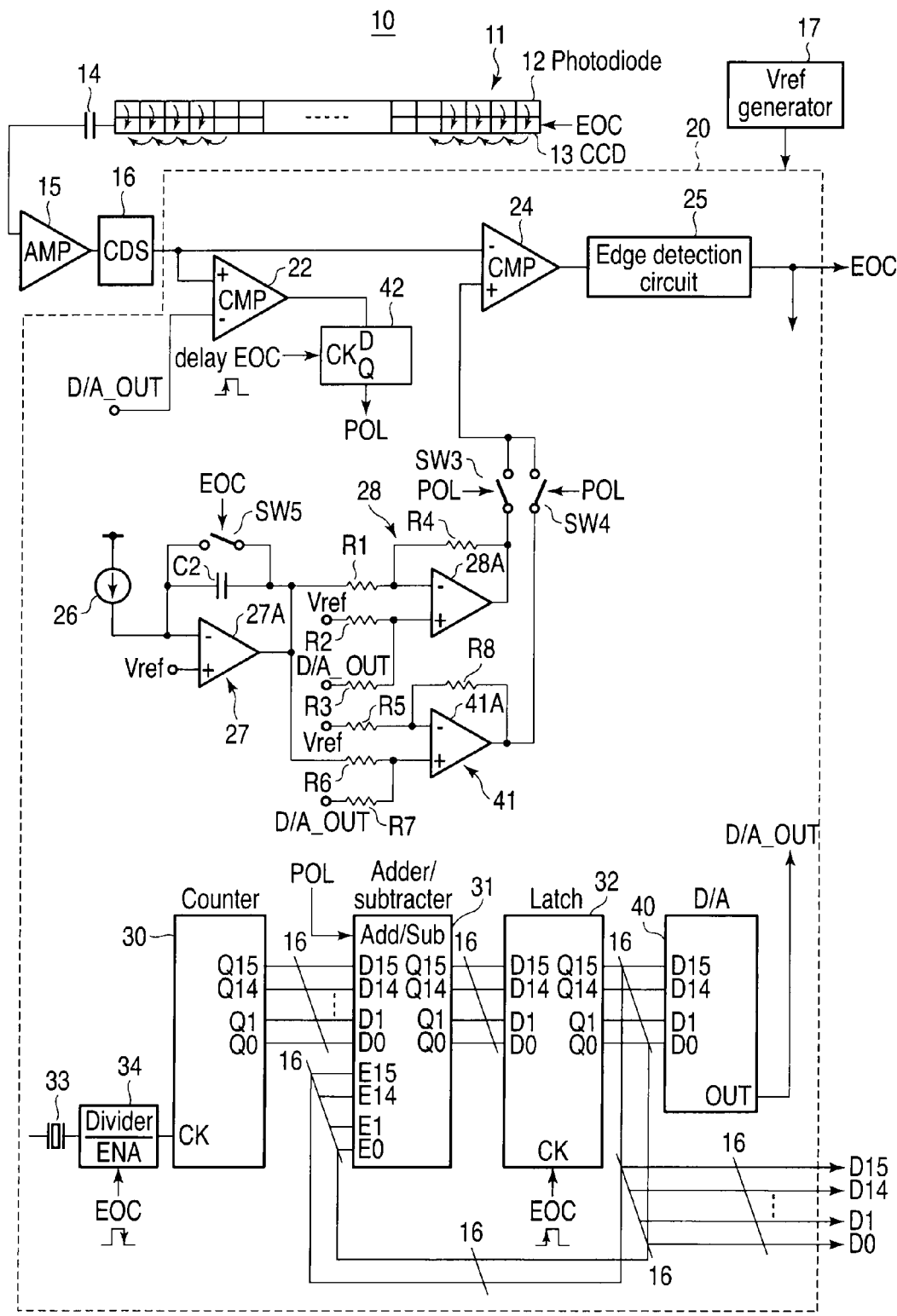
F I G. 8

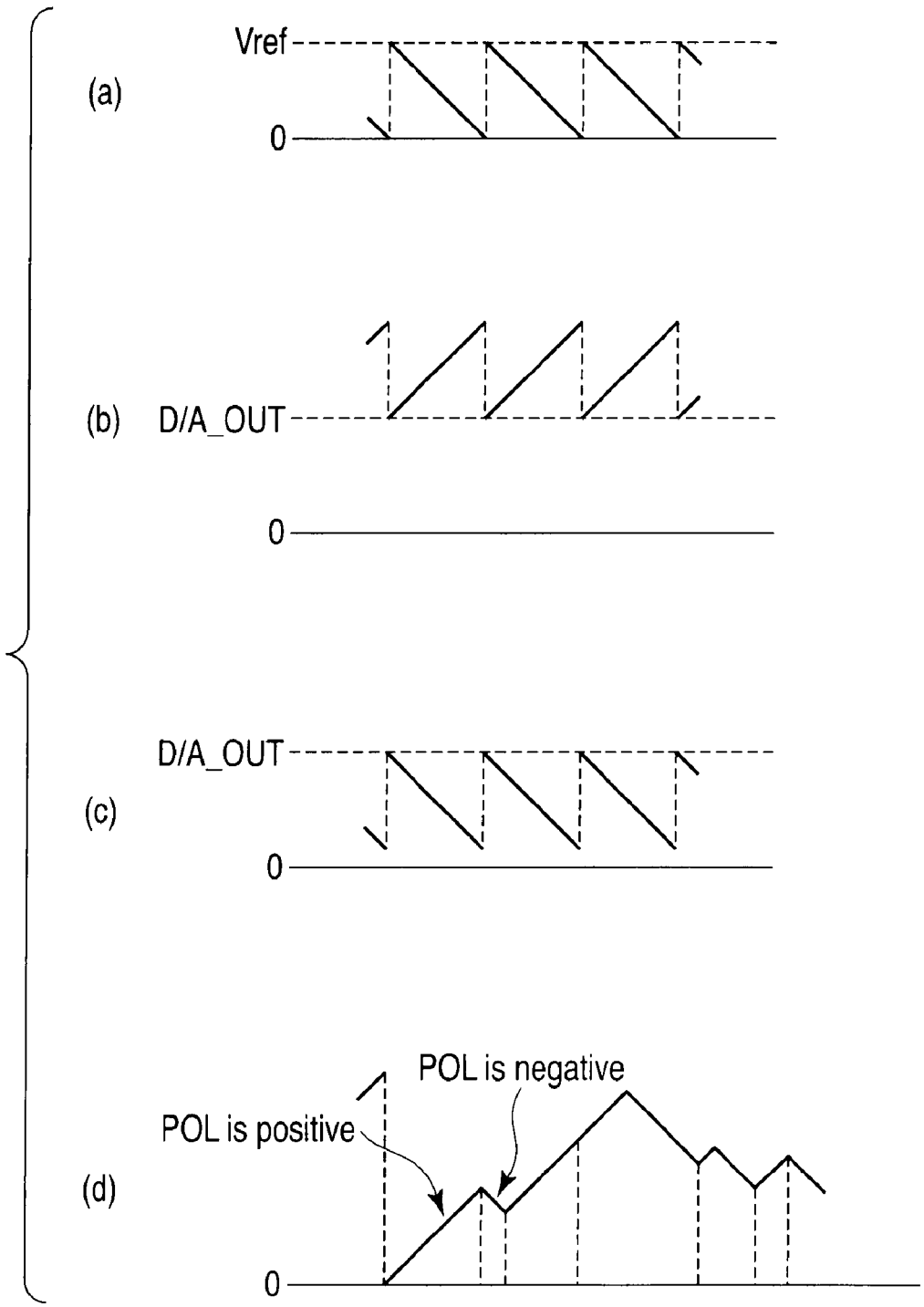
F I G. 9

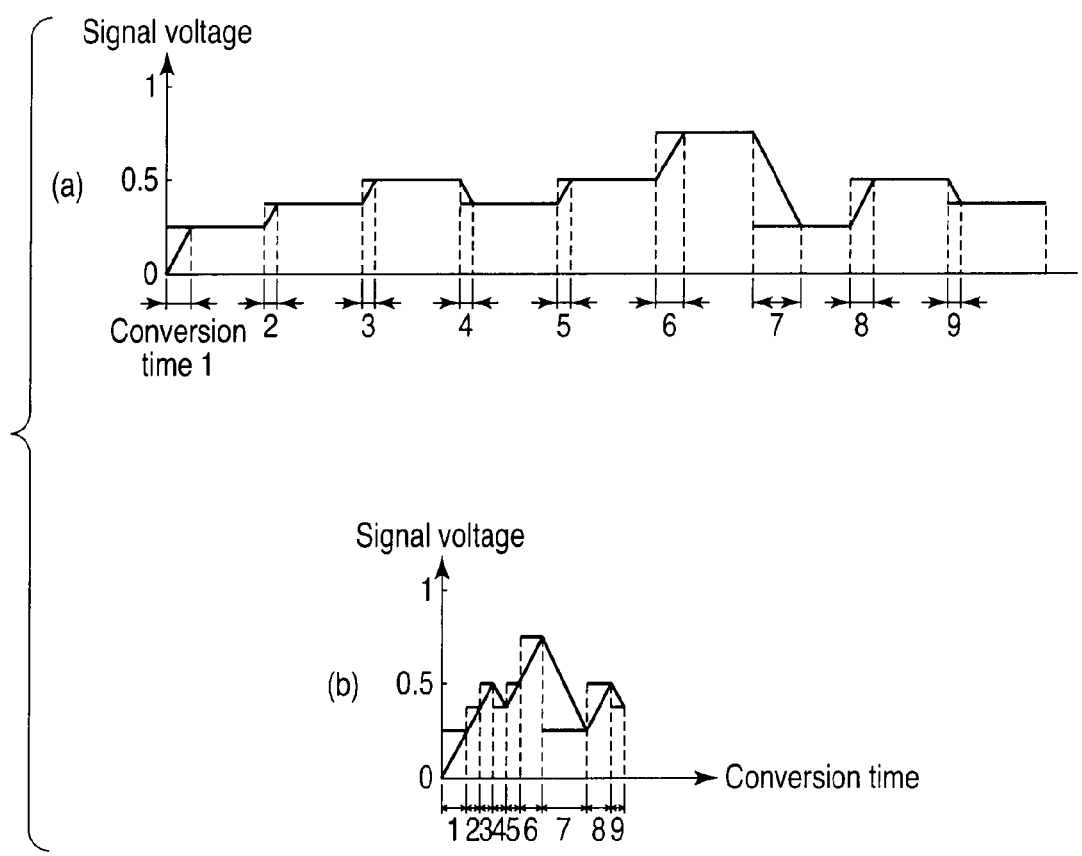
F I G. 10

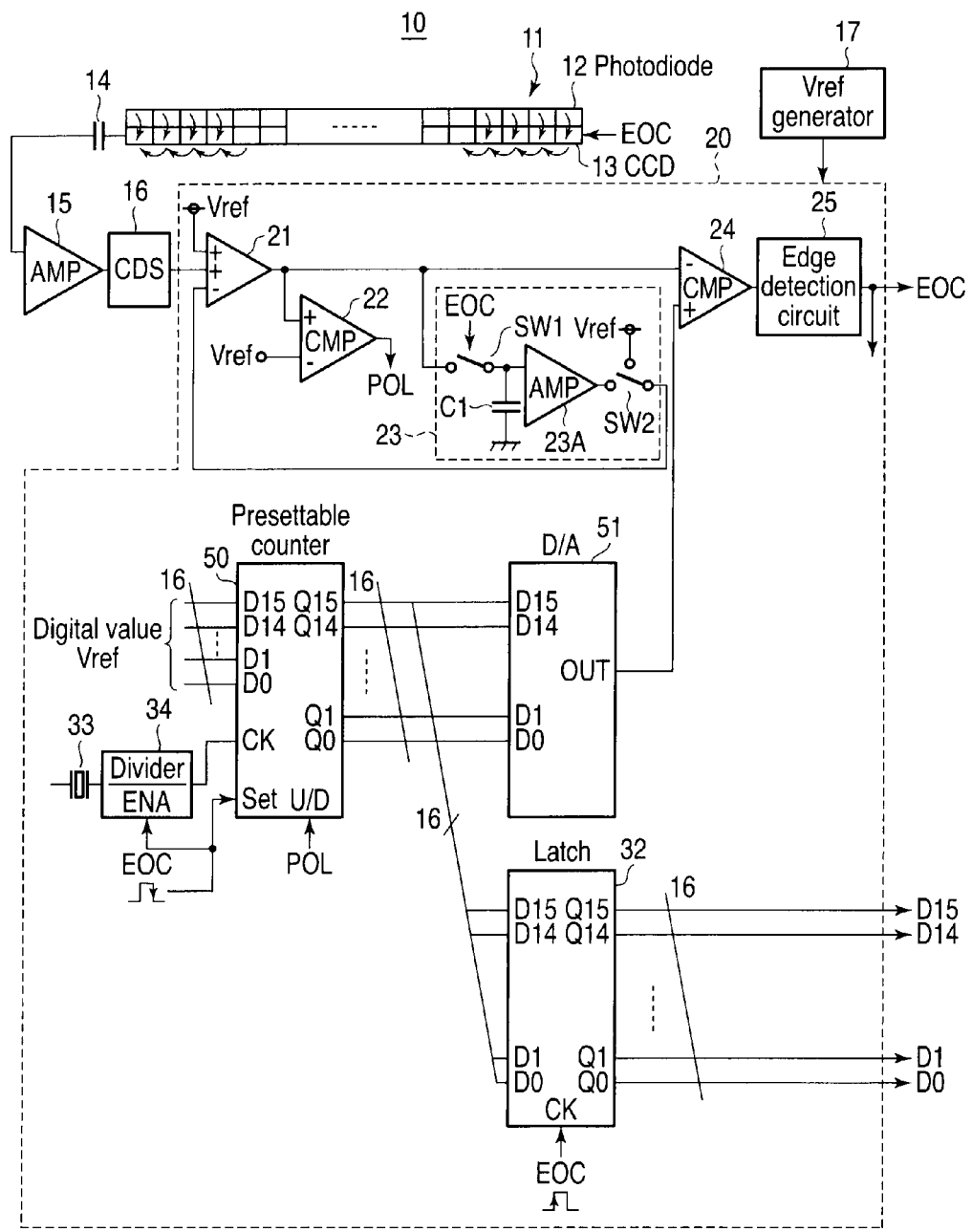
F I G. 11

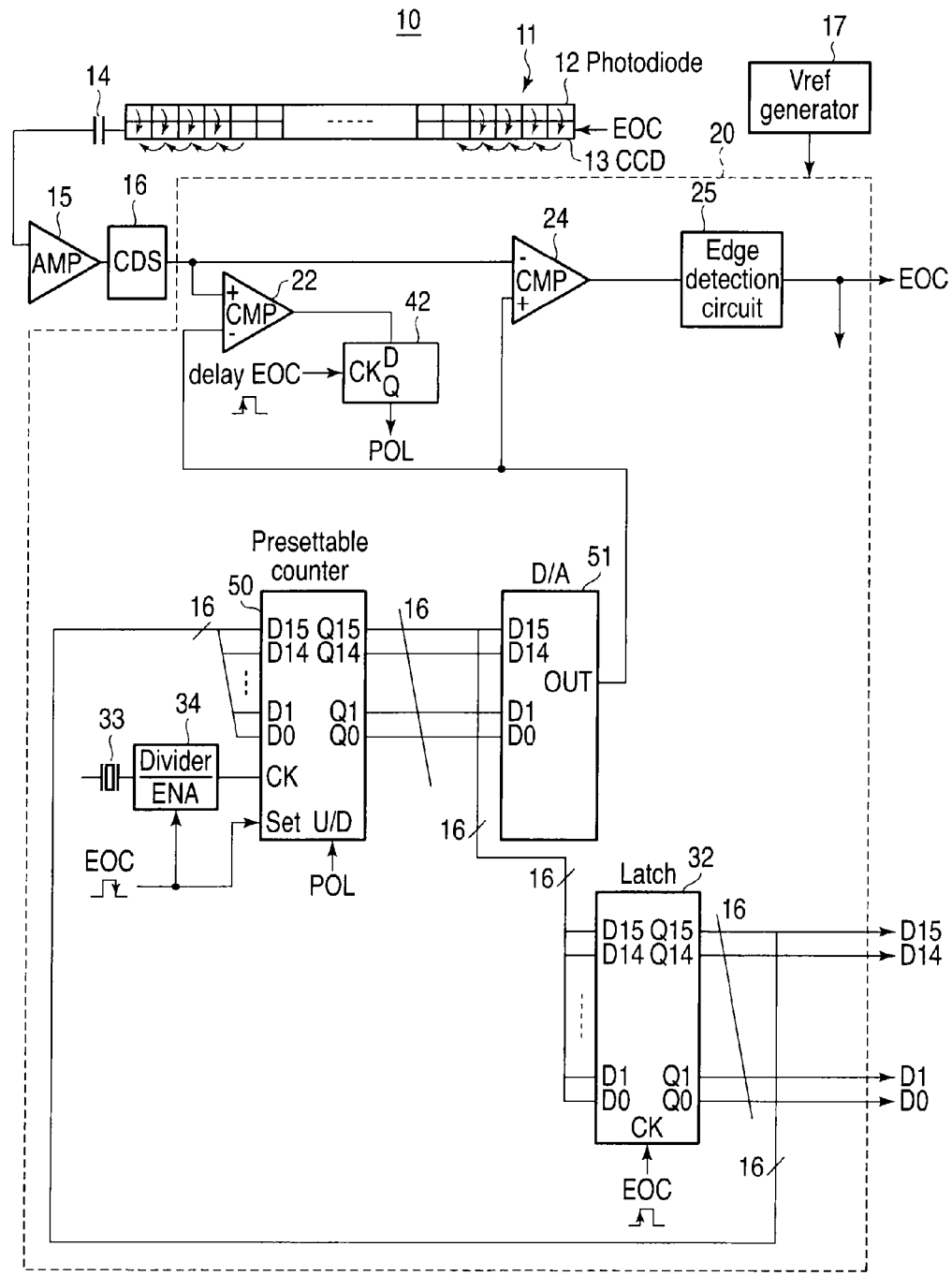
F I G. 12

A/D CONVERTER AND SOLID-STATE IMAGING DEVICE

CROSS-REFERENCE TO RELATED APPLICATIONS

This application is based upon and claims the benefit of priority from Japanese Patent Application No. 2009-217894, filed Sep. 18, 2009; the entire contents of which are incorporated herein by reference.

FIELD

Embodiments described herein relate generally to an A/D converter and a solid-state imaging device.

BACKGROUND

Demands for solid-state imaging devices are recently rapidly increasing for use in digital still cameras and video cameras to input images. Charge-coupled device (CCD) image sensors and complementary metal oxide semiconductor (CMOS) image sensors are widely used as solid-state imaging elements used in the solid-state imaging devices described above.

A solid-state imaging element is configured to comprise photodiodes which convert optical signals into electric signals, and electrically read an image projected on an imaging plane. A solid-state imaging device comprises an analog to digital (A/D) converter which converts electric signals (analog voltages) read by the solid-state imaging element into digital signals.

Conventional A/D converters for solid-state imaging elements operate in a manner as follows. At first, a reference voltage for a triangular wave is generated by a constant current source and an integrator. Subsequently, an analog voltage and a reference voltage are compared with each other by a comparator, to detect a time point when values thereof become equal. This time point is measured by a timer, an output of which is converted from an analog signal into a digital signal.

In this manner, however, the reference voltage is generated starting from 0 V as a start point.

Therefore, if an analog voltage to be subjected to digital conversion is high, a long time is required. Reading needs be performed at a data read speed of the imaging element, which is lowered so as to correspond to a conversion time for a maximum voltage. Therefore, a reading speed of a solid-state imaging device which combines a solid-state imaging element and an A/D converter is limited by a conversion speed of the A/D converter. Reading is difficult at a higher data transfer speed (data rate) than the conversion speed thereof.

BRIEF DESCRIPTION OF THE DRAWINGS

FIG. 1 is a circuit diagram illustrating a configuration of a solid-state imaging device 10 according to the first embodiment;

FIG. 8 is a circuit diagram illustrating a configuration of a solid-state imaging device 10 according to the second embodiment;

FIG. 9 represents output waveforms of an integrator 27, an inverter 28, and a voltage follower 29;

FIG. 10 represent a conversion time of an A/D converter 20 according to the second embodiment;

FIG. 11 is a circuit diagram illustrating a configuration of a solid-state imaging device 10 according to the third embodiment; and FIG. 12 is a circuit diagram illustrating a configuration of a solid-state imaging device 10 according to the third embodiment.

DETAILED DESCRIPTION

Figure 2:
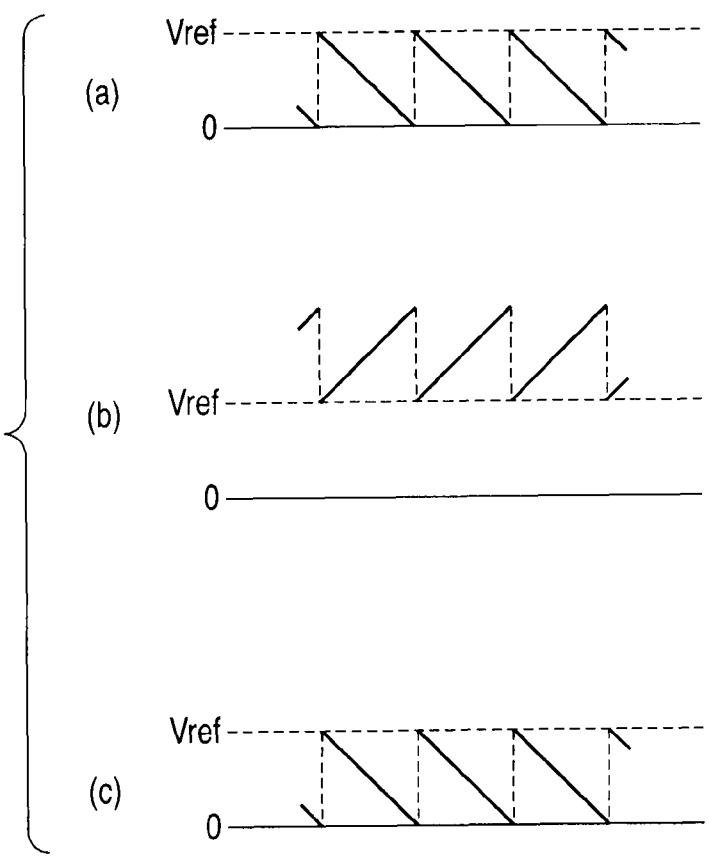
FIG. 2 represents output waveforms of an integrator 27, an inverter 28, and a voltage follower 29, respectively.

In general, according to one embodiment, there is provided an analog to digital (A/D) converter comprising:

a determination circuit configured to determine whether a first analog signal is greater than a second analog signal or not, the first analog signal being a present A/D conversion target, the second analog signal being an immediately preceding A/D conversion target;

a calculation circuit configured to add a reference voltage to a difference obtained by subtracting the second analog signal from the first analog signal;

a generation circuit configured to generate a comparison voltage rising from the reference voltage as an initial value if the first analog signal is greater than the second analog signal, and to generate a comparison voltage falling from the reference voltage as the initial value if the first analog signal is smaller than the second analog signal;

a comparator configured to compare a calculated value of the calculation circuit with the comparison voltage; and a conversion circuit configured to convert a period into a digital signal, the period being required until the calculated value is identical with the comparison voltage by the comparator.

The embodiments will be described hereinafter with reference to the accompanying drawings. In the description which follows, the same or functionally equivalent elements are denoted by the same reference numerals, to thereby simplify the description.

(First Embodiment)

FIG. 1 is a circuit diagram illustrating a configuration of a solid-state imaging device 10 according to the first embodiment. The solid-state imaging device 10 comprises a pixel array section 11, which is constituted by plural photoelectric conversion elements 12 (such as photodiodes) and a transfer register (CCD) 13. The CCD 13 transfers electric charges in one direction. FIG. 1 illustrates, as an example, a line-type pixel array.

The photodiodes 12 photoelectrically convert incident light into electric charges corresponding to an amount of the light, and accumulates the electric charges. The electric charges accumulated in the photodiodes 12 are read by the CCD 13. The CCD 13 sequentially transfers the electric charges read from the photodiodes 12 in one direction. The electric charges output from the CCD 13 are converted into a voltage by a capacitor 14. A signal voltage output from the capacitor 14 is fed through an amplifier (AMP) to a correlated-double-sampling (CDS) noise reduction circuit 16 where noise is removed from the signal voltage. Thereafter, the signal voltage is input to the A/D converter 20.

Also, the solid-state imaging device 10 comprises a Vref generator 17 which generates a reference voltage Vref. The reference voltage Vref generated by the Vref generator 17 is supplied to the A/D converter 20.

Next, a configuration and operation of the A/D converter 20 will be described. The A/D converter 20 comprises a triangular wave generation circuit which generates a triangular wave. The triangular wave generation circuit is constituted by an integrator 27, an inverter 28 and a voltage follower 29.

The integrator 27 receives an electric current from the constant current source 26 and generates a triangular wave. The integrator 27 comprises a differential amplifier 27A, a capacitor C2 and a switch element SW5. The differential amplifier 27A has a plus input terminal which is input with a positive reference voltage Vref, and a minus input terminal which is connected to the constant current source 26. Between an output and the minus input terminal of the differential amplifier 27A, a feedback path is connected through the capacitor C2. The switch element SW5 is connected in parallel to the capacitor C2. The switch element SW5 is controlled to switch on/off by an end-of-conversion (EOC) signal as an output of an edge detection circuit 25 described later. The EOC signal is constituted by a pulse. When the pulse is high, the switch element SW5 is on, and the electric charges accumulated in the capacitor C2 are thereby discharged.

FIG. 2(a) represents an output waveform of the integrator 27. The integrator 27 has an output which oscillates to a negative side since the constant current source 26 is connected to the minus input terminal thereof. Therefore, the integrator 27 generates a reference triangular wave which falls from the reference voltage Vref by applying with a positive reference voltage as a bias. The reference triangular wave is input to the inverter 28 and the voltage follower 29.

The inverter 28 is constituted by a differential amplifier 28A and four resistors R1 to R4. An output of the differential amplifier 27 is connected to the minus input terminal of the differential amplifier 28A. Between an output and the minus input terminal of the differential amplifier 28A, a feedback path is inserted through the resistor R4. A plus input terminal of the differential amplifier 28A is applied with a voltage 2Vref through the resistor R2. Also, the plus input terminal of the differential amplifier 28A is connected to an end of the resistor R3, another end of which is grounded. The resistors R1 and R4 have equal resistance values, and the resistors R2 and R3 have equal resistance values. Accordingly, the plus input terminal of the differential amplifier 28A is applied with the reference voltage Vref.

FIG. 2(b) represents an output waveform of the inverter 28. The inverter 28 inverts the reference triangular wave from the integrator 27, and adds the reference voltage Vref, thereby to generate a triangular wave which rises from the reference voltage Vref.

FIG. 2(c) represents an output waveform of the voltage follower 29. The voltage follower 29 functions as a buffer and outputs the same waveform as the reference triangular wave from the integrator 27.

Thus, the reference triangular wave has a waveform which falls at the same ratio from the reference voltage Vref. Therefore, triangular waves respectively rise and fall from the reference voltage Vref, which acts as a center. Even a reference voltage Vref having a voltage value of 0 does not deviate from the substance of the present embodiment but has an undesirable feature that two of plus and minus power supplies are required, in order to generate two types of triangular waves.

On the other hand, there is a desirable feature that the reference voltage Vref is a stable reference of 0 V (GND).

An output of the inverter 28 is connected to a plus input terminal of the comparator 24 through a switch element SW3. An output of the voltage follower 29 is connected to a plus input terminal of the comparator 24 through a switch element SW4.

A signal voltage for one pixel, which is input to the A/D converter 20 from the CCD 13, is further input to the plus input terminal of an adder/subtracter 21. The adder/subtracter (calculation circuit) 21 performs addition/subtraction for analog signals. The plus input terminal of the adder/subtracter 21 is applied with the reference voltage Vref. A minus input terminal of the adder/subtracter 21 is input with an immediately preceding pixel signal value. That is, the adder/subtracter 21 adds the reference voltage Vref to a signal voltage for one pixel, which is read from the pixel array section 11, and generates a voltage obtained by subtracting an immediately preceding pixel signal voltage. The reference voltage Vref is thus added to hinder a calculation result from becoming minus.

Thus, the present embodiment generates a voltage by adding the reference voltage Vref to a signal voltage for one pixel and by subtracting an immediately preceding pixel signal voltage. For a natural picture or a printed character, a present signal and an immediately preceding signal, which is a pixel signal of an adjacent pixel, have equal or close numerical values very frequently. The voltage calculated by the adder/subtracter 21 very frequently becomes a numerical value close to the reference voltage Vref. Accordingly, a conversion speed can be increased by A/D-converting only a difference between an immediately preceding signal with use of a counter.

A retaining circuit which holds an immediately preceding signal voltage is constituted by a analog sample-and-hold circuit 23. The sample-and-hold circuit 23 is configured to comprise an amplifier 23A, switch elements SW1 and SW2, and a capacitor C1. The switch element SW2 is connected to the reference voltage Vref before a holding operation, and an output of the sample-and-hold circuit 23 is thereby set to Vref. The switch element SW1 is controlled to switch on/off by a EOC signal. The switch element SW1 switches on when digital conversion of a present pixel signal voltage ends, i.e., in synchronization with a rise of the EOC signal. A signal voltage is thereby held by the capacitor C1. Thereafter, the switch element SW1 is switched off, and the switch element SW2 is connected to the amplifier 23A. The signal voltage held by the sample-and-hold circuit 23 is used as an immediately preceding pixel signal voltage.

If there is no immediately preceding pixel output (i.e., in case of a first pixel), the immediately preceding numerical value is 0. Only in this case, the output of the adder/subtracter 21 is a signal voltage obtained by adding the reference voltage Vref to the pixels signal.

A comparator (determination circuit) 22 compares the present signal voltage with the immediately preceding signal voltage. In actuality, the comparator 22 compares the output of the adder/subtracter 21 with the reference voltage Vref. That is, a comparison between the present and immediately preceding signal voltages is carried out by determining a polarity of a result of subtracting the immediately preceding signal voltage from the present signal voltage by the adder/subtracter 21. The comparator 22 outputs a comparison result as a polarity determination signal POL.

If the present signal voltage is determined to be lower than the immediately preceding signal voltage from the comparison result of the comparator 22, a triangular wave which falls from an immediately preceding value as a start point may be selected and compared with the present signal voltage. Otherwise, if the present signal voltage is determined to be higher than the immediately preceding signal voltage, a triangular wave which rises from the immediately preceding value as a start point may be selected and compared with the present signal voltage. In this manner, a comparison result can be expected to be obtained at an earlier timing than when using a triangular wave which rises from 0 as a start point.

Therefore, if a present signal voltage is lower than an immediately preceding signal voltage, a triangular wave having a waveform which falls from the reference voltage Vref is selected. Otherwise, if the present signal voltage is higher than an immediately preceding signal voltage, the triangular wave having a waveform which rises from the reference voltage Vref is selected. This selection operation is performed by the switch elements SW3 and SW4 which are controlled to switch on/off by the polarity determination signal POL from the comparator 22. If a present signal voltage is lower than an immediately preceding one, i.e., if the polarity determination signal POL is negative, the switch element SW4 switches on and the switch element SW3 switches off. Otherwise, if a present signal voltage is higher than an immediately preceding one, i.e., if the polarity determination signal POL is positive, the switch element SW3 switches on and the switch element SW4 switches off.

The comparator 24 compares the output of the adder/subtracter 21 with the triangular wave (a comparison voltage). Further, the comparator 24 detects a time point when the aforementioned two signals become equal. Attention is to be paid to the following. When a present value is lower, the logic is right, and an initial output is therefore at a high level. Hence, a waveform which changes to a low level at the instance when the values become equal to each other is obtained. Inversely, when an immediately preceding one is higher, the logic is wrong, and the initial output is therefore at a low level. Hence, a waveform which changes to a high level at the instance when the values become equal to each other is obtained.

Accordingly, the output of the comparator 24 is not an absolute value, which is either at a high or low level, but requires a determination of an instance when values become equal, by capturing a status change of high-to-low level transition or low-to-high level transition. Therefore, the output of the comparator 24 is connected to an edge detection circuit 25 which detects an edge of a waveform.

Figure 3:
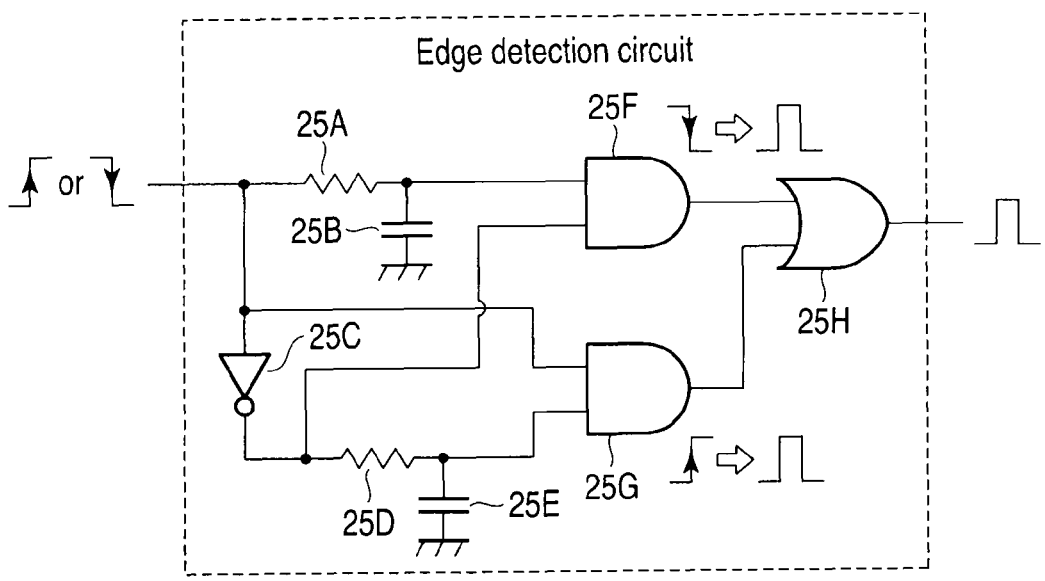
FIG. 3 is a circuit diagram illustrating an example of an edge detection circuit 25.

FIG. 3 is a circuit diagram illustrating an example of the edge detection circuit 25. The edge detection circuit 25 is constituted by two resistors 25A and 25D, two capacitors 25B and 25E, an inverter circuit 25C, two AND circuits 25F and 25G, and an OR circuit 25H. The register 25A and capacitor 25B constitute a delay circuit, and the register 25D and capacitor 25E constitute a delay circuit. The AND circuit 25F generates a pulse by capturing a status change of high-to-low level transition. The AND circuit 25G generates a pulse by capturing a status change of low-to-high level transition. With this configuration, the edge detection circuit 25 can detect an edge of a waveform. Of course, the edge detection circuit 25 can be constituted by any other circuit than that of FIG. 3.

A clock terminal CK of a counter 30 is input with a clock generated by an oscillator 33 and a divider 34. The clock corresponds to, for example, elapsed time. The EOC signal is input to an enable terminal /ENA of the divider 34. The divider 34 starts outputting the clock in synchronization with a fall of the EOC signal, and stops outputting the clock in synchronization with a next rise of the EOC signal. The counter 30 is constituted by, for example, a 16-bit counter.

The counter 30 counts the clock from the divider 34 and outputs a digital signal thereof from output terminals Q0 to Q16. Upon an end of A/D conversion for each one pixel, the counter 30 is cleared.

If the digital signal from the counter 30 is held on the basis of the output of the comparator 24 when values become equal, the held digital signal expresses a difference from an immediately preceding value. Therefore, if the A/D converter 20 employs a data format of outputting a difference, the digital signal of the counter 30 is directly output. Alternatively, if a format of outputting an absolute value is employed, a digital signal obtained by adding a present difference to an immediately preceding value needs to be output. An adder/subtracter 31 is provided for the latter purpose. Therefore, an absolute value is output as data, in the configuration of FIG. 1. If data is to be compressed and transmitted, outputting of a difference is recommended because a difference can be more compressed than an absolute value. However, data transmission methods are not subject matters of the present embodiment, and descriptions thereof will therefore not be made beyond introducing several methods for transmitting data.

Input terminals D0 to D15 of the adder/subtracter 31 are input with a digital signal from the counter 30. Input terminals E0 to 515 of the adder/subtracter 31 are input with an immediately preceding pixel signal from a latch circuit 32. An addition/subtraction switch terminal Add/Sub of the adder/subtracter 31 is input with the polarity determination signal POL. If the polarity determination signal POL is positive, the adder/subtracter 31 performs an addition processing. Otherwise, if the polarity determination signal POL is negative, the adder/subtracter 31 performs a subtraction processing. Accordingly, based on the polarity determination signal POL, the adder/subtracter 31 outputs, through the output terminals Q0 to Q16, a value obtained by adding the digital signal from the counter 30 to the immediately preceding pixel signal, or a value obtained by subtracting the digital signal from the counter 30, from the immediately preceding pixel signal.

The output from the adder/subtracter 31 is latched by the latch circuit 32. A clock terminal of the latch circuit 32 is input with the EOC signal, and the latch circuit 32 performs a latch operation at the time point when the digital conversion ends, i.e., in synchronization with a rise of the EOC signal. The digital signal latched by the latch circuit 32 is output to outside as a digital signal for the A/D converter 20, and is input to the adder/subtracter 31.

In this manner, only the difference between signals is subjected to A/D conversion, and the conversion speed can be expected to increase. However, if the speed of the whole solid-state imaging device 10 is limited by the A/D conversion, an operation speed of the solid-state imaging device 10 can be improved by executing reading of a next pixel by electric charge transfer after an end of the conversion. That is, the EOC signal indicating an end of A/D conversion is used as an electric charge transfer clock for the CCD 13 or as a read clock for the CMOS image sensor. In this manner, a signal voltage of a next pixel can be read immediately after an end of A/D conversion, and therefore, the read speed of the solid-state imaging device improves.

Figure 4:
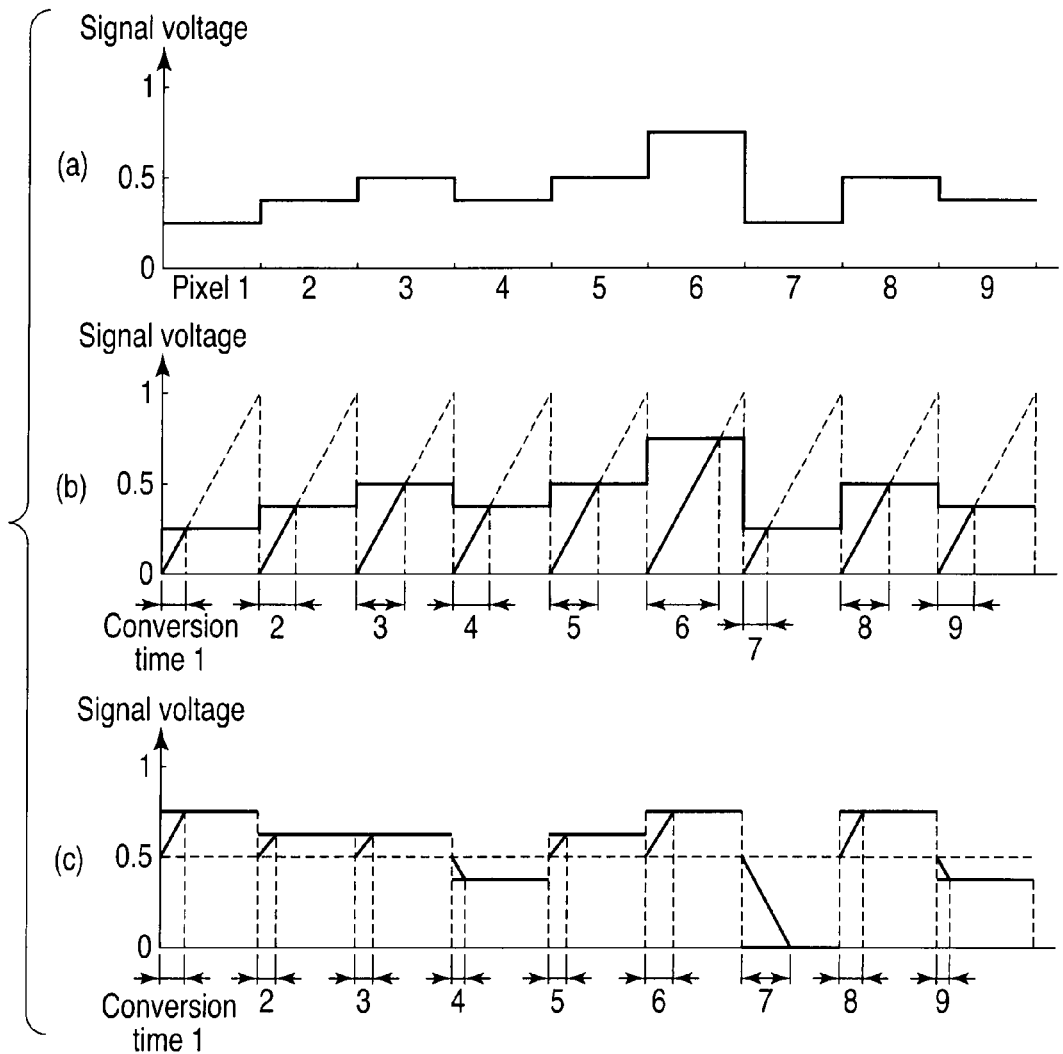
FIG. 4 represents a conversion time of an A/D converter 20 according to the first embodiment.

FIG. 4 represents a conversion time of the A/D converter 20. FIG. 4(a) represents electric charge amounts (signal voltages) of pixels 1 to 9 arrayed in a line. FIG. 4(a) exemplifies a natural picture, in which signal voltages vary gently. FIG. 4(b) represents a conversion time of a conventional A/D converter which starts conversion from 0 V for each pixel. FIG. 4(c) represents a conversion time of the A/D converter 20 according to the first embodiment.

According to a conventional scheme as represented in FIG. 4(b), conversion starts with reference to 0 V, and therefore, the total conversion time is long. In particular, the pixel 6 takes a longer time than other pixels.

Figure 5:
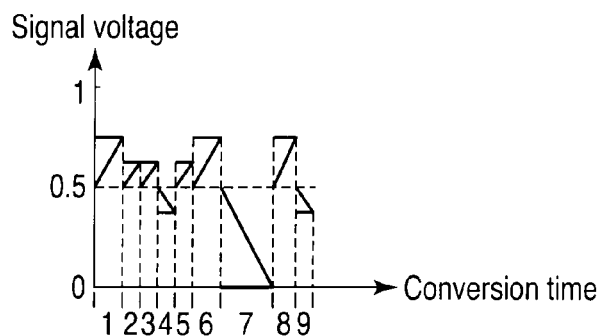
FIG. 5 represents a conversion time of the A/D converter 20 according to the first embodiment.

On the other hand, as represented in FIG. 4(c), the reference voltage Vref is set to 0.5 V, according to the present embodiment, and a difference between a present signal voltage and an immediately preceding signal voltage is subjected to A/D conversion, starting from 0.5 V. FIG. 5 is an altered version of FIG. 4(c) in which a conversion time is represented on the horizontal axis. Thus, the first embodiment can greatly shorten a conversion time in comparison with the conventional scheme.

Figure 6:
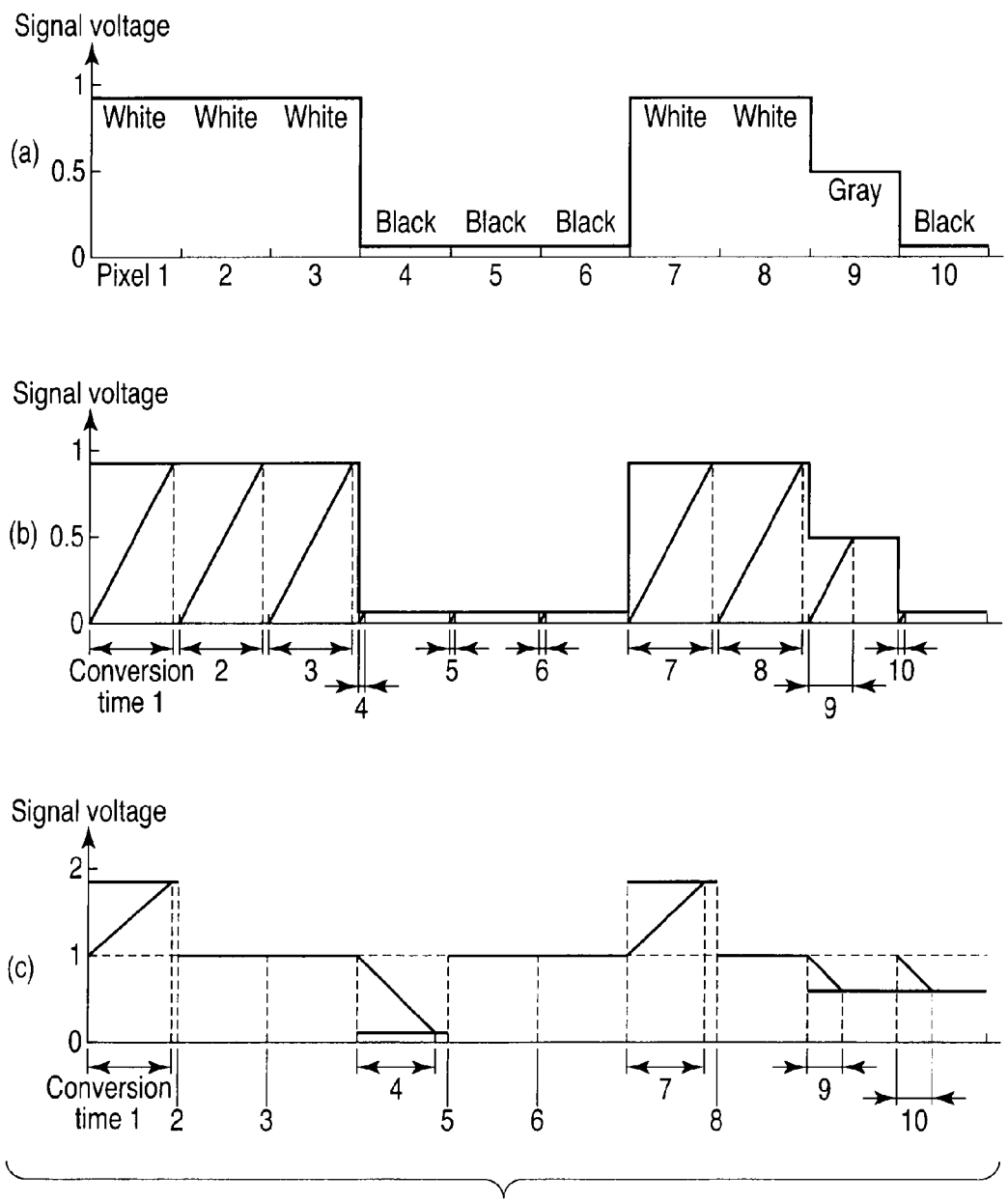
FIG. 6 represents another example of a conversion time of the A/D converter 20 according to the first embodiment.

FIG. 6 represents another example of a conversion time of the A/D converter 20. FIG. 6(a) represents electric charge amounts (signal voltages) of pixels 1 to 9 arrayed in a line. FIG. 6(a) exemplifies a character image. In a character image, white pixels appear overwhelmingly frequently, and black pixels continue in areas forming part of a character. FIG. 6(b) represents a conversion time of a conventional A/D converter. FIG. 6(c) represents a conversion time of the A/D converter 20 according to the first embodiment.

According to a conventional scheme as represented in FIG. 6(b), conversion starts with reference to 0 V, and therefore, the whole conversion time is long. In particular, white pixels take a longer time than other pixels.

On the other hand, as represented in FIG. 6(c), the reference voltage Vref is set to 1 V, according to the present embodiment, and a difference between a present signal voltage and an immediately preceding signal voltage is subjected to A/D conversion, starting from 1. For the pixels 2, 3, 5, 6, and 8, the conversion time is 0. Thus, the first embodiment can greatly shorten a conversion time in comparison with the conventional scheme.

As specifically described above, the first embodiment utilizes a natural phenomenon that output values of neighboring pixels are often close to each other. Only a difference between each present pixel output and an immediately preceding pixel output is converted into a digital signal by using the counter 30. Therefore, at first, a reference voltage Vref is set as a start point, and triangular waves respectively rising and falling from the reference voltage Vref are generated. Further, a difference between a present pixel output and an immediately preceding pixel output is calculated. The calculated difference is added with the reference voltage Vref to make a value close to the start point of the triangular waves. Further, if the present pixel output is greater than the immediately preceding pixel output, a comparative calculation with the present pixel output is performed by using the rising triangular wave. Otherwise, if the present pixel output is smaller than the immediately preceding pixel output, the comparative calculation with the immediately preceding pixel output is performed by using the falling triangular wave.

Therefore, according to the first embodiment, only the difference between each present pixel output and an immediately preceding pixel output thereof need be digitally converted, so that an A/D conversion time can be greatly shortened. In this manner, the read speed of the solid-state imaging device 10 can be improved.

Also, the EOC signal indicating an end of A/D conversion is used as an electric charge transfer clock for the CCD 13. As a result, a CCD drive speed can be so fast that a solid-state imaging device capable of high-speed reading can be achieved.

Figure 7:
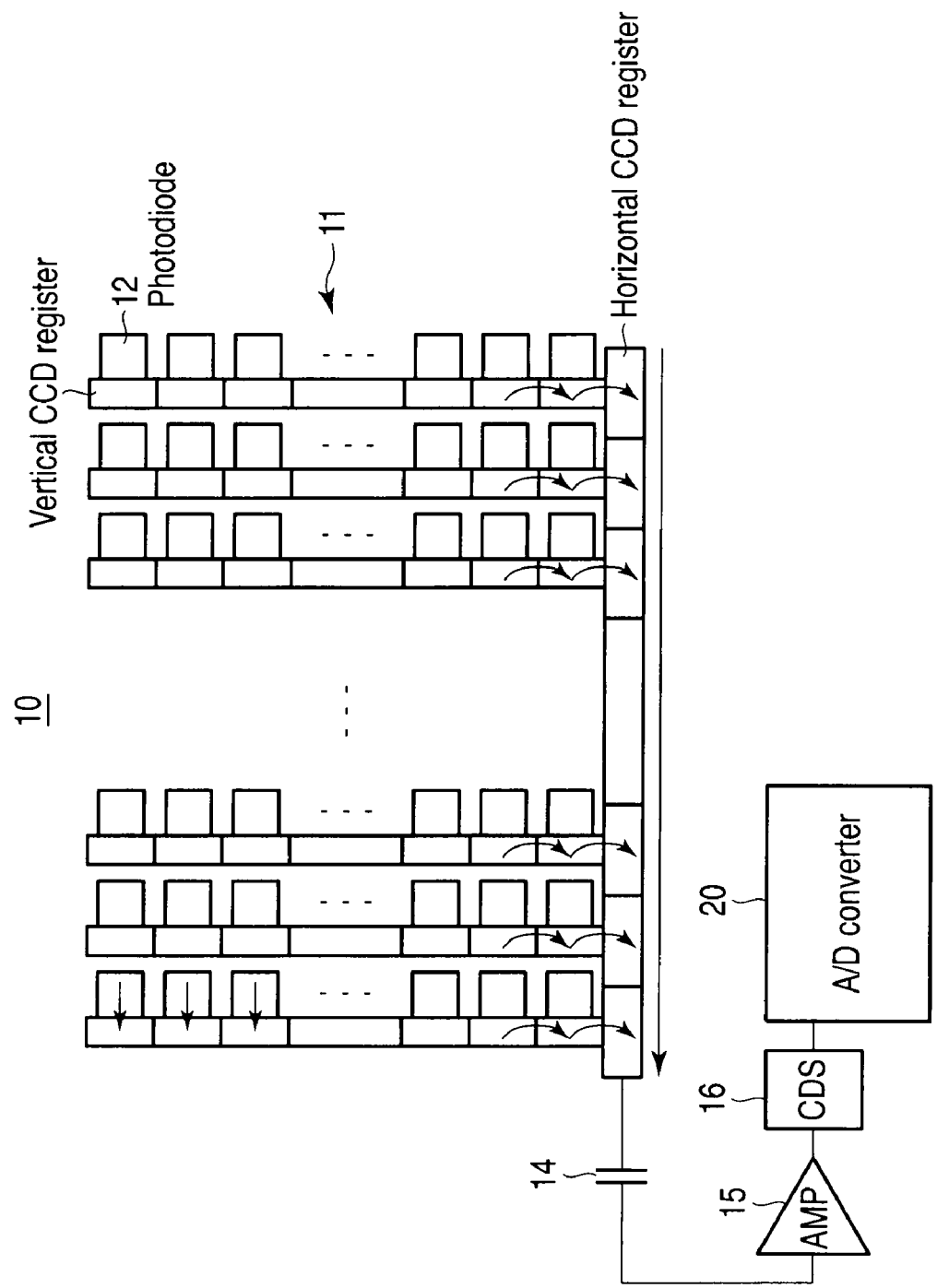
FIG. 7 is a block diagram illustrating an example of another configuration of a pixel array section 11.

In contrast to FIG. 1 which exemplifies a one-dimensional pixel array, a two-dimensional array is configured as in FIG. 7. The pixel array section 11 is constituted by: plural photodiodes 12 which are two-dimensionally arrayed in row directions (vertical directions) and column directions (horizontal directions) in a matrix; plural vertical transfer registers (vertical CCD registers), which are provided respectively for vertical columns of the array and vertically transfer electric charges read from the photodiodes 12; and a horizontal transfer register (horizontal CCD register) which is arrayed at lower ends of the plural vertical CCD registers and receive electric charges transferred in units of rows from the plural vertical CCD registers. The horizontal CCD registers sequentially transfer electric charges in the horizontal direction, for one after another of rows, which are transferred from the plural vertical CCD register groups. Further, the vertical CCD registers and horizontal CCD registers use the EOC signal as an electric charge transfer clock.

Thus, the pixel array section 11 may be configured in either a one-dimensional or two-dimensional array. For pixels, not only a CCD sensor but also a CMOS image sensor may be used. The same as described here also applies to embodiments below.

(Second Embodiment)

The first embodiment has a feature that comparison is made with a triangular wave configured to have a waveform which rises or falls from a reference voltage Vref. An immediately preceding value is merely an example in the case of using an analog sample hold circuit. Since the output of the A/D converter 20 is a digital signal, the second embodiment is configured to digitally hold the immediately preceding value and subject the immediately preceding value to a D/A converter. The immediately preceding value is fed back as an analog signal which has once become a digital signal. The fed back analog signal is used as an immediately preceding pixel signal voltage. The second embodiment is the same as the first embodiment except that a method of holding an immediately preceding value is digital and that a triangular wave as a comparative target takes an immediately preceding pixel signal as a start point.

FIG. 8 is a circuit diagram illustrating a configuration of a solid-state imaging device 10 according to the second embodiment. The A/D converter 20 comprises a D/A converter 40 which converts a digital signal latched by a latch circuit 32 into an analog signal. An analog output D/A_OUT from the D/A converter 40 is input to a comparator 22, an inverter 28, and an adder 41, and is used as an immediately preceding pixel signal voltage.

The A/D converter 20 is constituted by an integrator 27, an inverter 28, and an adder 41, and comprises a triangular wave generation circuit which generates a triangular wave. The integrator 27 receives an electric current from a constant current source 26 and generates a reference triangular wave. FIG. 9(a) represents an output waveform of the integrator 27.

The inverter 28 is constituted by a differential amplifier 28A and four resistors R1 to R4. An output of the differential amplifier 27 is connected to the minus input terminal of the differential amplifier 28A. Between an output and the minus input terminal of the differential amplifier 28A, a feedback path is inserted through the resistor R4. A plus input terminal of the differential amplifier 28A is applied with a reference voltage Vref through the resistor R2. Also, the plus input terminal of the differential amplifier 28A is applied with an analog signal D/A_OUT through the resistor R3. The resistors R1 and R4 have equal resistance values as well as the resistors R2 and R3 have equal resistance values. FIG. 9(b) represents an output waveform of the inverter 28. The inverter 28 can generate a triangular wave which rises from the analog signal D/A_OUT by inverting the reference triangular wave from the integrator 27 and adding the reference voltage Vref and analog signal D/A_OUT.

The adder 41 is constituted by a differential amplifier 41A and four resistors R5 to R8. An output of the integrator 27 is connected to a plus input terminal of the differential amplifier 28A through the register R6. A plus input terminal of the differential amplifier 28A is applied with the analog signal D/A_OUT through the resistor R7. A minus input terminal of the differential amplifier 28A is applied with the reference voltage Vref through the resistor R5. Between an output and the minus input terminal of the differential amplifier 28A, a feedback path is connected through the resistor R8. The resistors R5 and R8 have equal resistance values, and the resistors R6 and R7 have equal resistance values. FIG. 9(c) represents an output waveform of the adder 41. The adder 41 can output a triangular wave which falls from the analog signal D/A_OUT by adding the analog signal D/A_OUT to the reference triangular wave from the integrator 27 and by further subtracting the reference voltage Vref from the waveform.

As in the first embodiment, the reference voltage Vref is added to the generated triangular wave in order to prevent the triangular wave from oscillating to a minus side. However, even a reference voltage Vref of 0 V does not deviate from the substance of the present embodiment.

An output of the inverter 28 is connected to a plus input terminal of a comparator 24. An output of the adder 41 is connected to a plus input terminal of the comparator 24 through a switch element SW4.

A comparator (determination circuit) 22 compares a present signal voltage with the analog signal D/A_OUT, i.e., an immediately preceding signal voltage. An output of the comparator 22 is connected to an input of a latch circuit 42. A clock terminal of the latch circuit 42 is input with a delayed EOC signal which is delayed by a predetermined time. In synchronization with a rise of the delayed signal, the latch circuit 42 latches an output of the comparator 22. An output of the latch circuit 42 is input as a polarity determination signal POL to switch elements SW3 and SW4 and an adder/subtracter (conversion circuit) 31.

If the present signal voltage is determined to be lower than an immediately preceding signal voltage from a comparison result of the comparator 22, a triangular wave which falls from an immediately preceding value as a start point may be selected and compared with the present signal voltage. Otherwise, if the present signal voltage is determined to be higher than the immediately preceding signal voltage, a triangular wave which rises from an immediately preceding value as a start point may be selected and compared with the present signal voltage. In this manner, a comparison result is expected to be obtained at an earlier timing than in a comparison of using a triangular wave which rises from 0 as a start point.

Therefore, if a present signal voltage is lower than an immediately preceding signal voltage, a triangular wave having a waveform which falls from the analog signal D/A_OUT is selected. Otherwise, if the present signal voltage is higher than the immediately preceding signal voltage, the triangular wave having a waveform which rises from the analog signal D/A_OUT is selected. This selection operation is performed by the switch elements SW3 and SW4 which are controlled to switch on/off by the polarity determination signal POL from the comparator 22.

FIG. 9(d) represents a waveform controlled by the switch elements SW3 and SW4, i.e., a waveform input to the plus input terminal of the comparator 24. If a present signal voltage is higher than an immediately preceding one, i.e., if the polarity determination signal POL is positive, the switch element SW3 switches on and the switch element SW4 switches off. Accordingly, a waveform which rises from the analog signal D/A_OUT is obtained. Otherwise, if a present signal voltage is lower than an immediately preceding one, i.e., the polarity determination signal POL is negative, the switch element SW4 switches on and the switch element SW3 switches off. Accordingly, a waveform which falls from the analog signal D/A_OUT is obtained.

The comparator 24 compares a present signal voltage with a triangular wave generated by the inverter 28 and the adder 41. Further, the comparator 24 detects a time point when voltages of the aforementioned two signals become equal. An output of the comparator 24 is connected to an edge detection circuit 25 which generates the EOC signal.

Thereafter, a digital signal of a pixel signal voltage is obtained by a counter 30, an adder/subtracter 31, and a latch circuit 32, as in the first embodiment.

FIG. 10(a) represents a conversion time of the A/D converter 20 according to the second embodiment. The same example as FIG. 4(a) is used for electric charge amounts (signal voltages) of pixels 1 to 9 arrayed in a line. In the second embodiment, a comparison is started from an immediately preceding signal voltage, and a difference between a present signal voltage and the immediately preceding signal voltage is subjected to A/D conversion. FIG. 10(b) is an altered version of FIG. 10(a) in which the conversion time is represented on the horizontal axis. Thus, the second embodiment can greatly shorten the conversion time in comparison with the conventional scheme.

As specifically described above, the second embodiment generates an analog signal D/A_OUT by performing D/A conversion on a digital signal as an output of the A/D converter 20 which has been subjected to A/D conversion. The analog signal D/A_OUT is used as an immediately preceding signal voltage. Further, triangular waves respectively rising and falling from the analog signal D/A_OUT as a start point are generated. If a present pixel output is greater than an immediately preceding pixel output, a comparative calculation with the immediately preceding pixel output is performed by using the rising triangular wave. Otherwise, if the present pixel output is smaller than the immediately preceding pixel output, the comparative calculation with the immediately preceding pixel output is performed by using the falling triangular wave. Further, only a difference between the present pixel output and the immediately preceding pixel output is converted into a digital signal by using the counter 30.

Therefore, according to the second embodiment, only the difference between each present pixel output and an immediately preceding pixel output thereof need be digitally converted by the counter 30, so that an A/D conversion time can be greatly shortened. In this manner, the read speed of the solid-state imaging device 10 can be improved. In addition, the EOC signal indicating an end of A/D conversion is used as an electric charge transfer clock for the CCD 13, as in the first embodiment.

(Third Embodiment)

In the first embodiment, a constant current source and an integrator are used to generate triangular waves. In the third embodiment, however, triangular waves are generated by performing D/A conversion on an output of a counter which counts a clock with reference to a reference voltage Vref as an initial value.

FIG. 11 is a circuit diagram representing a configuration of the solid-state imaging device 10 according to the third embodiment. In the third embodiment, triangular waves respectively rising and falling from a reference voltage Vref as a start point, as has been described in the first embodiment, are generated by a presettable counter 50 and a D/A converter 51.

Input terminals D0 to D15 of the presettable counter 50 are input with a digital signal of the reference voltage Vref. A set terminal of the presettable counter 50 is input with an EOC signal. The presettable counter 50 presets the digital signal of the reference voltage Vref in itself, in synchronization with a fall of the EOC signal. A clock terminal CK of the presettable counter 50 is input with a clock generated by an oscillator 33 and a divider 34. An up/down terminal U/D of the presettable counter 50 is input with a polarity determination signal POL. The presettable counter 50 counts up if the polarity determination signal POL is positive, or counts down if the polarity determination signal polarity determination signal is negative. An output of the presettable counter 50 is subjected to D/A conversion by the D/A converter 51.

The presettable counter 50 and D/A converter 51 configured as described above can generate, as an analog signal, a triangular wave which rises from the reference voltage Vref as a start point if the polarity determination signal POL is positive, or a triangular wave which falls from the reference voltage Vref as a start point if the polarity determination signal POL is negative.

A comparator 24 compares an output of an adder/subtracter (calculation circuit) 31 and a triangular wave (a comparison voltage). The comparator 24 detects a time point when voltages of the foregoing two signals become equal. The EOC signal is generated as the edge detection circuit 25 detects an edge for a detection result of the comparator 24.

The latch circuit 32 latches an output of the presettable counter 50 in synchronization with a rise of the EOC signal. The digital signal latched by the latch circuit 32 becomes a value obtained by digitally converting a present pixel signal voltage.

As specifically described above, the third embodiment generates a triangular wave which rises or falls from the reference voltage Vref by counting up or down a clock from the reference voltage Vref as a start point. Further, a difference between each present pixel output and an immediately preceding pixel output thereof is calculated and added with the reference voltage Vref, to obtain a value close to the start point of the triangular waves as a comparative target of the comparator 24. Further, a digital signal corresponding to a voltage of a triangular wave when the voltage becomes equal to the present pixel output is output as a value obtained by subjecting the present pixel output to A/D conversion. Therefore, the third embodiment can achieve the same effects as the first embodiment.

(Fourth Embodiment)

The fourth embodiment is configured to generate triangular waves by performing D/A conversion on an output of a counter which counts a clock from an immediately preceding pixel signal as an initial value. FIG. 12 is a circuit diagram illustrating a configuration of a solid-state imaging device 10 according to the fourth embodiment.

A digital signal latched by a latch circuit 32 is preset, as an immediately preceding pixel signal, in a presettable counter 50. The presettable counter 50 counts a clock from the immediately preceding pixel signal as a start point.

Whether the presettable counter 50 counts up or down is specified by a polarity determination signal POL, and an output of the presettable counter 50 is subjected to D/A conversion by a D/A converter 51. In this manner, a triangular wave which rises or falls depending on a polarity determined by the comparator (determination circuit) 22 can be generated, from an immediately preceding pixel signal as a start point.

As specifically described above, the fourth embodiment generates a triangular wave which rises or falls from an immediately preceding pixel output by counting up or down a clock from the immediately preceding pixel output as a start point. Further, a difference between a present pixel output and the immediately preceding pixel output is calculated and added to a digital signal of the immediately preceding pixel output. Therefore, the fourth embodiment can obtain the same effects as in the first embodiment.

Each of the above embodiments has been described with reference to an A/D converter 20, assuming a solid-state imaging device. However, the A/D converter 20 in each of the embodiments is also applicable to devices other than solid-state imaging devices. Specifically, the A/D converter 20 in each of the embodiments can be used as an A/D converter which converts, into a digital signal, or an analog signal of, for example, audio, a pressure sensor, an acceleration sensor (for an airbag), or a flow meter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An analog to digital (A/D) converter comprising:
    a determination circuit configured to determine whether a first analog signal is greater than a second analog signal or not, the first analog signal being a present A/D conversion target, the second analog signal being an immediately preceding A/D conversion target;
    a calculation circuit configured to add a reference voltage to a difference obtained by subtracting the second analog signal from the first analog signal;
    a generation circuit configured to generate a comparison voltage rising from the reference voltage as an initial value if the first analog signal is greater than the second analog signal, and to generate a comparison voltage falling from the reference voltage as the initial value if the first analog signal is smaller than the second analog signal;
    a comparator configured to compare a calculated value of the calculation circuit with the comparison voltage; and
    a conversion circuit configured to convert a period into a digital signal, the period being required until the calculated value is identical with the comparison voltage by the comparator.

2. The A/D converter of claim 1, further comprising a hold circuit configured to hold the second analog signal.

3. The A/D converter of claim 1, wherein
    the conversion circuit comprises a counter which counts a clock during the period, and
    the digital signal is a count value of the counter.

4. The A/D converter of claim 1, further comprising a detection circuit configured to detect a time point when the calculated value is identical with the comparison voltage by the comparator, and to generate an end-of-conversion signal,
    wherein the conversion circuit performs a conversion operation, based on the end-of-conversion signal.

5. The A/D converter of claim 1, wherein the first and second analog signals are pixel signals of a solid-state imaging device.

6. A solid-state imaging device comprising:
- a pixel array in which a plurality of pixels each comprising a photoelectric element are arrayed;
- a voltage generator configured to generate a reference voltage; and
- an A/D converter configured to A/D-convert pixel signals from the pixel array,
- the A/D converter comprising:
  - a determination circuit configured to determine whether a first analog signal is greater than a second analog signal or not, the first analog signal being a pixel signal as a present A/D conversion target, the second analog signal being a pixel signal as an immediately preceding A/D conversion target;
  - a calculation circuit configured to add a reference voltage to a difference obtained by subtracting the second analog signal from the first analog signal;
  - a generation circuit configured to generate a comparison voltage rising from the reference voltage as an initial value if the first analog signal is greater than the second analog signal, and to generate a comparison voltage falling from the reference voltage as the initial value if the first analog signal is smaller than the second analog signal;
  - a comparator configured to compare a calculated value of the calculation circuit with the comparison voltage; and
  - a conversion circuit configured to convert a period into a digital signal, the period being required until the calculated value is identical with the comparison voltage by the comparator.

7. An analog to digital (A/D) converter comprising:
- a determination circuit configured to determine whether a first analog signal is greater than a second analog signal or not, the first analog signal being a present A/D conversion target, the second analog signal being an immediately preceding A/D conversion target;
- a generation circuit configured to generate a comparison voltage rising from the second analog signal as an initial value if the first analog signal is greater than the second analog signal, and to generate a comparison voltage falling from the second analog signal as the initial value if the first analog signal is smaller than the second analog signal;
- a comparator configured to compare the first analog signal with the comparison voltage; and
- a conversion circuit configured to convert a period into a digital signal, the period being required until the first analog signal is identical with the comparison voltage by the comparator.

8. The A/D converter of claim 7, further comprising a digital-to-analog (D/A) converter configured to convert, into an analog signal, a digital signal into which the second analog signal has been A/D-converted,
wherein the second analog signal is a signal converted by the D/A converter.

9. The A/D converter of claim 7, wherein
the conversion circuit comprises a counter which counts a clock during the period, and
the digital signal is a count value of the counter.

10. The A/D converter of claim 7, further comprising a detection circuit configured to detect a time point when the first analog signal is identical with the comparison voltage by the comparator, and to generate an end-of-conversion signal, wherein the conversion circuit performs a conversion operation, based on the end-of-conversion signal.

11. The A/D converter of claim 7, wherein the first and second analog signals are pixel signals of a solid-state imaging device.

12. An analog to digital (A/D) converter comprising:
- a determination circuit configured to determine whether a first analog signal is greater than a second analog signal or not, the first analog signal being a present A/D conversion target, the second analog signal being an immediately preceding A/D conversion target;
- a calculation circuit configured to add a reference voltage to a difference obtained by subtracting the second analog signal from the first analog signal;
- a generation circuit configured to generate a comparison voltage rising from the reference voltage as an initial value if the first analog signal is greater than the second analog signal, and to generate a comparison voltage falling from the reference voltage as the initial value if the first analog signal is smaller than the second analog signal;
- a comparator configured to compare a calculated value of the calculation circuit with the comparison voltage; and
- a first hold circuit configured to hold a digital signal of the comparison voltage at a time point when the calculated value is identical with the comparison voltage by the comparator, the held digital signal being a digital signal into which the first analog signal has been A/D converted.

13. The A/D converter of claim 12, further comprising a D/A converter configured to convert the digital signal of the comparison voltage into an analog signal,
wherein the comparator uses the analog signal of the comparison voltage.

14. The A/D converter of claim 12, further comprising a second hold circuit configured to hold the second analog signal.

15. The A/D converter of claim 12, wherein
the generation circuit comprises a counter which counts a clock with the reference voltage as a preset value during a period required until the calculated value is identical with the comparison voltage by the comparator, and
the digital signal of the comparison voltage is a count value of the counter.

16. The A/D converter of claim 12, further comprising a detection circuit configured to detect the time point, and to generate an end-of-conversion signal,
wherein the first hold circuit performs a hold operation, based on the end-of-conversion signal.

17. An analog to digital (A/D) converter comprising:
- a determination circuit configured to determine whether a first analog signal is greater than a second analog signal or not, the first analog signal being a present A/D conversion target, the second analog signal being an immediately preceding A/D conversion target;
- a generation circuit configured to generate a comparison voltage rising from the second analog signal as an initial value if the first analog signal is greater than the second analog signal, and to generate a comparison voltage falling from the second analog signal as the initial value if the first analog signal is smaller than the second analog signal;
- a comparator configured to compare the first analog signal with the comparison voltage; and
- a hold circuit configured to hold a digital signal of the comparison voltage at a time point when the first analog signal is identical with the comparison voltage by the comparator, the held digital signal being a digital signal into which the first analog signal has been A/D converted.

18. The A/D converter of claim 17, further comprising a D/A converter configured to convert the digital signal of the comparison voltage into an analog signal,
  wherein the comparator uses the analog signal of the comparison voltage.

19. The A/D converter of claim 17, wherein
  the generation circuit comprises a counter which counts a clock with the second analog signal as a preset value during a period required until the first analog signal is identical with the comparison voltage by the comparator, and
  the digital signal of the comparison voltage is a count value of the counter.

20. The A/D converter of claim 17, further comprising a detection circuit configured to detect the time point, and to generate an end-of-conversion signal,
  wherein the hold circuit performs a hold operation, based on the end-of-conversion signal.

* * * * *